(12) United States Patent
Allen et al.

(10) Patent No.: US 9,082,624 B2
(45) Date of Patent: Jul. 14, 2015

(54) SIGNAL PATH OF A MULTIPLE-PATTERNED SEMICONDUCTOR DEVICE

(71) Applicant: International Business Machines Corporation, Armonk, NY (US)

(72) Inventors: David H. Allen, Rochester, MN (US); Douglas M. Dewanz, Rochester, MN (US); David P. Paulsen, Dodge Center, MN (US); John E. Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/732,525

(22) Filed: Jan. 2, 2013

(65) Prior Publication Data
US 2014/0184320 A1 Jul. 3, 2014

(51) Int. Cl.
| | |
|---|---|
| G06F 17/50 | (2006.01) |
| G03F 1/00 | (2012.01) |
| H01L 21/033 | (2006.01) |
| H01L 27/02 | (2006.01) |
| H01L 23/528 | (2006.01) |

(52) U.S. Cl.
CPC ........ *H01L 21/0337* (2013.01); *H01L 27/0207* (2013.01); *H01L 23/5286* (2013.01); *H01L 2924/0002* (2013.01)

(58) Field of Classification Search
CPC ............ H01L 23/1527; G06F 17/5077; G06F 7/70456; G06F 7/2063
USPC ............. 716/51, 55, 106, 109, 111, 114, 126, 716/130, 132; 430/5
See application file for complete search history.

(56) References Cited

U.S. PATENT DOCUMENTS

| | | | |
|---|---|---|---|
| 4,308,090 A | 12/1981 | Te Velde et al. | |
| 5,561,317 A | 10/1996 | Momma et al. | |
| 5,841,664 A * | 11/1998 | Cai et al. ....................... | 716/130 |
| 5,888,676 A | 3/1999 | Saitoh | |
| 6,175,138 B1 | 1/2001 | Noda | |
| 6,496,035 B2 * | 12/2002 | Jensen et al. .................... | 326/47 |
| 6,611,944 B2 | 8/2003 | Elzinga | |
| 6,841,465 B2 | 1/2005 | Choi | |
| 7,047,514 B2 | 5/2006 | Mizuno et al. | |
| 7,139,152 B2 * | 11/2006 | Mahnad et al. ............ | 360/77.12 |
| 7,216,314 B2 | 5/2007 | Decloedt | |
| 7,239,174 B2 * | 7/2007 | Madurawe ...................... | 326/38 |
| 7,323,717 B2 | 1/2008 | Koyama et al. | |

(Continued)

FOREIGN PATENT DOCUMENTS

JP 2002151592 A 5/2002

OTHER PUBLICATIONS

Mack, C., "Semiconductor Lithography", Chris Mack, Gentleman Scientist, pp. 1-12. http://www.lithoguru.com/scientist/lithobasics.html, filed Jan. 2, 2013.

(Continued)

*Primary Examiner* — Helen Rossoshek
(74) *Attorney, Agent, or Firm* — Peder M. Jacobson; Robert R. Williams

(57) ABSTRACT

A multiple-patterned semiconductor device is provided. The semiconductor device includes one or more layers with signal tracks defined by masks and a structure for transferring a signal between signal tracks and repowering the signal.

12 Claims, 5 Drawing Sheets

(56) References Cited

U.S. PATENT DOCUMENTS

| | | | |
|---|---|---|---|
| 7,334,208 B1* | 2/2008 | Cox | 716/129 |
| 7,523,436 B2 | 4/2009 | Mizuno et al. | |
| 7,739,624 B2* | 6/2010 | McElvain et al. | 716/101 |
| 7,781,149 B2 | 8/2010 | Paxton et al. | |
| 7,861,196 B2 | 12/2010 | Huckabay et al. | |
| 8,236,663 B2 | 8/2012 | Coolbaugh et al. | |
| 8,386,979 B2 | 2/2013 | McElvain et al. | |
| 8,448,120 B2* | 5/2013 | Huang et al. | 716/126 |
| 8,468,484 B2 | 6/2013 | Lilja | |
| 8,475,872 B2 | 7/2013 | Kang et al. | |
| 8,531,203 B2* | 9/2013 | Christensen et al. | 324/762.09 |
| 8,533,641 B2 | 9/2013 | Park et al. | |
| 8,558,286 B2* | 10/2013 | Tian et al. | 257/226 |
| 8,560,998 B1* | 10/2013 | Salowe et al. | 716/126 |
| 8,572,522 B2 | 10/2013 | Iwase et al. | |
| 8,578,304 B1* | 11/2013 | Behrends et al. | 716/51 |
| 8,601,411 B2* | 12/2013 | Chen et al. | 716/55 |
| 8,703,574 B2 | 4/2014 | Gaynor et al. | |
| 8,709,684 B2 | 4/2014 | Chern et al. | |
| 2008/0192164 A1 | 8/2008 | Jung et al. | |
| 2009/0283903 A1 | 11/2009 | Park | |
| 2010/0199253 A1* | 8/2010 | Cheng et al. | 716/13 |
| 2011/0006998 A1* | 1/2011 | Kang et al. | 345/173 |
| 2011/0014786 A1 | 1/2011 | Sezginer et al. | |
| 2011/0207328 A1* | 8/2011 | Speakman | 438/694 |
| 2012/0025403 A1 | 2/2012 | Yokogawa | |
| 2012/0119304 A1 | 5/2012 | Sugimae et al. | |
| 2012/0151430 A1 | 6/2012 | Emmanuel et al. | |
| 2012/0193814 A1 | 8/2012 | Dunne et al. | |
| 2013/0032885 A1 | 2/2013 | Swamynathan et al. | |
| 2013/0149638 A1* | 6/2013 | Ogadhoh et al. | 430/5 |
| 2013/0154128 A1* | 6/2013 | Wang et al. | 257/786 |
| 2013/0175631 A1 | 7/2013 | Behrends et al. | |
| 2013/0244427 A1 | 9/2013 | Yuan et al. | |
| 2013/0263065 A1* | 10/2013 | Chen et al. | 716/55 |
| 2013/0295727 A1* | 11/2013 | Hsu et al. | 438/130 |

OTHER PUBLICATIONS

Allen, et al., "Signal Path and Method of Manufacturing a Multiple-Patterned Semiconductor Device", filed Jan. 2, 2013, IBM.

* cited by examiner

SIGNAL PATH OF A MULTIPLE-PATTERNED SEMICONDUCTOR DEVICE

TECHNICAL FIELD

This disclosure relates generally to a semiconductor device and, more particularly, relates a multiple-patterned semiconductor device.

BACKGROUND

The semiconductor industry is producing more and more capable components with smaller and smaller feature sizes. Due to the increased demand for highly integrated semiconductor devices, advanced techniques of fabricating more semiconductor devices in a smaller die area have become strongly relied upon. The production of such semiconductor devices reveals new design and manufacturing challenges to be addressed in order to maintain or improve semiconductor device performance.

As the device density of semiconductors increases, the conductor line width and spacing within the semiconductor devices decreases. Multiple-pattern lithography represents a class of technologies developed for photolithography to enhance the feature density of semiconductor devices. Double-patterning, a subset of multiple-patterning, may be used as early as the 45 nm node in the semiconductor industry and may be the primary technique for the 32 nm node and beyond. Double-patterning employs multiple masks and photolithographic steps to create a particular level of a semiconductor device. With benefits such as tighter pitches and narrower wires, double-patterning alters relationships between variables related to semiconductor device wiring and wire quality to sustain performance.

SUMMARY

In an embodiment, this disclosure relates to a multiple-patterned semiconductor device. The semiconductor device may include one or more layers. A particular level of the semiconductor device may include signal tracks defined by different masks and exposures. The semiconductor device may include a structure which may transfer and repower a signal. Aspects may assist in achieving a timing tolerance standard for carrying a signal on a semiconductor device. Aspects may take into account less than ideal wires. Aspects may assist in preserving signal quality. Aspects may take into account space limitations. Aspects of the disclosure may not add aspects increasing space required for a semiconductor device to operate properly. In an embodiment, aspects may use one layer of a semiconductor device. In other embodiments, aspects may use multiple layers of a semiconductor device.

DETAILED DESCRIPTION

Figure 1:
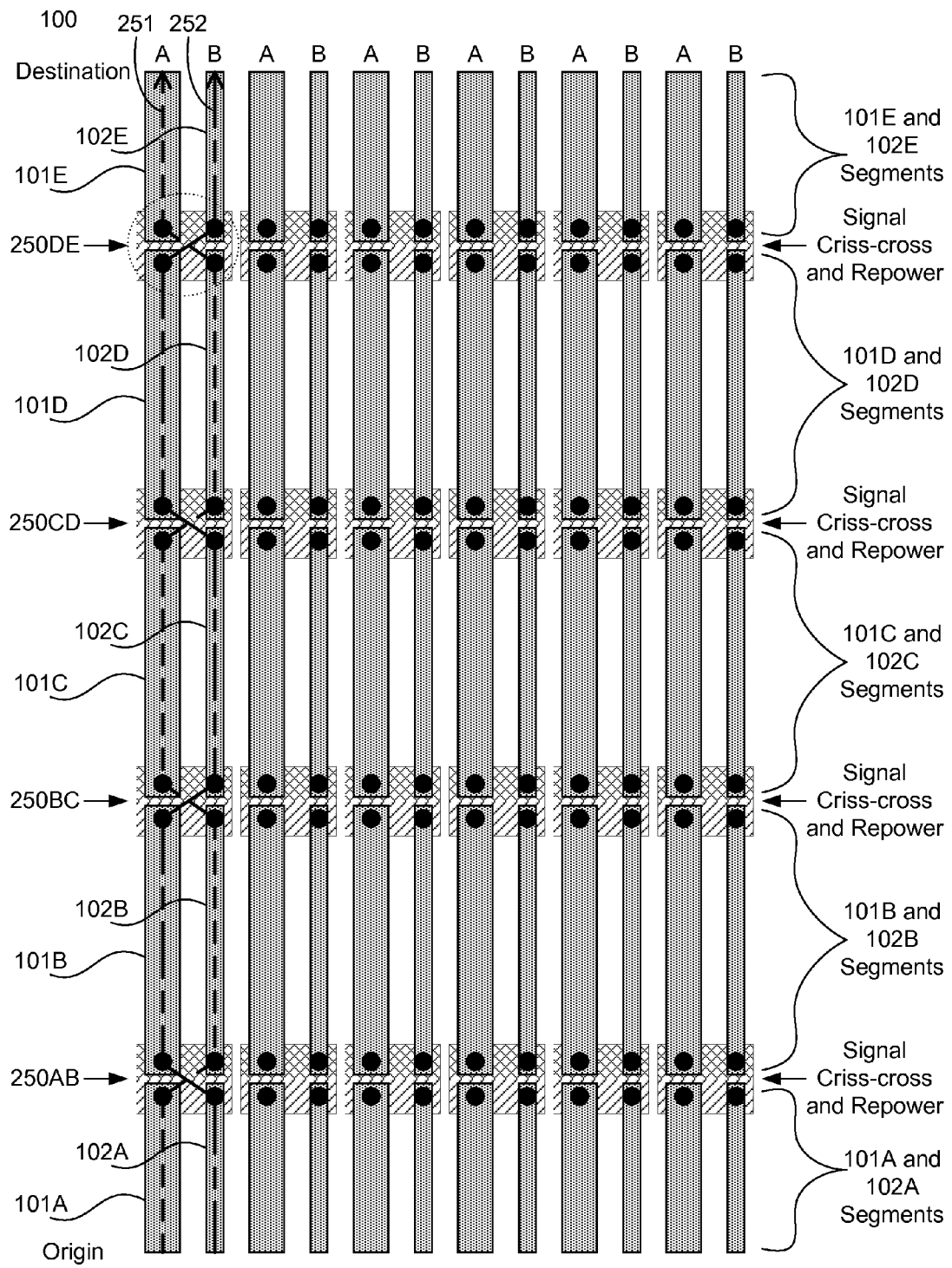
FIG. 1 is a planar view showing double-patterned signal tracks carrying wires, repeater structure locations, and example signal paths pursuant to the disclosure.

As conductor line width and pitch geometries decrease, the use of double-patterning on a particular level may increase in order to achieve the required conductor dimensions while still using existing state of the art lithographic exposure equipment. A benefit of double-patterning includes the ability to form tight conductor pitches; however, double-patterning may introduce other variables related to timing and noise into the semiconductor process. Double-patterns alter relationships between adjacent wires in both width and spacing. Adjacent wire channels may be defined in separate lithography steps. Distinctions between adjacent wires may arise due to lithographic exposure variations and registration or placement errors of one exposure relative to another. The need to design for non-optimal wires restricts semiconductor design variables, such as signal repeater spacing, which may affect semiconductor die size.

Single level patterning enables straightforward characterization of parameters with signal delay implications such as wire width, height, and spacing variations. A product of a resistance value (R) of a wire and a capacitance value (C) of the wire forms an RC time constant for the wire (note this is an approximation since the R and the C are distributed along the wire length). Historically, a decrease in wire width or thickness brings about a resistance increase and a corresponding capacitance decrease. The C decrease approximately offsets the R increase in the RC time constant. Such capacitance decrease occurs in part due to a reduction in lateral capacitance because the space between wires increases as wire width decreases. Similarly, an increase in wire width or thickness brings about a resistance decrease approximately offset in the RC time constant by a corresponding capacitance increase. Such a capacitance increase occurs in part due to a rise in lateral capacitance because the space between wires decreases as wire width increases. Thus, in conventional, single-patterned wires the RC time constant remains within appropriate limits of tolerance.

Double-patterning prompts a different nature of lateral capacitance relative to single level patterning. In double-patterning, the width of adjacent wires is rather independent, i.e., track poorly. Wire widths may not track well between adjacent wires created using separate exposures. Relatively narrow wires may be next to or between relatively wide wires. Double-patterning creates varying lateral capacitance between adjacent wires effectively separate from wire resistance variations. The resistance value (R) and the capacitance value (C) may fail to counterbalance each other across process variations. For example, a highly resistive wire may have high R and high C. Thus, the RC time constant between adjacent wires may vary significantly. Wires of one pattern of a double-pattern may carry a signal faster than wires of the other pattern. This may cause signals to reach their respective destinations at different times. Early analysis of a particular 14-15 nm technology indicates a potential doubling of worst case lateral capacitance between adjacent wires, doubling of coupled noise, and increased total wire C by as much as 50%. Such variations may require a solution to mitigate these effects. Potential solutions include repeaters more frequently placed or wires separated more. Such solutions may increase semiconductor die size. Increasing semiconductor die size may be discouraged and may negatively impact the ability to use such a semiconductor device in some systems. Using signal tracks from more than one pattern to carry a signal may achieve desirable results related to signal timing.

A semiconductor device may include a layer which may conduct a signal. Such a signal conductor layer may be multiple-patterned. In an embodiment, the layer may be double-patterned. Photolithography steps may involve separate masks including a first mask and a second mask. Adjacent wire channels may be defined with such separate masks in separate lithography steps. A first pattern with a wire channel may carry an "A wire" and a second pattern with a wire channel may carry a "B wire." Wiring channels may alternate in layout for "A wires" and "B wires." Thus, an "A wire" may exist between "B wires" and a "B wire" may exist between "A wires."

A repeater structure may transfer, or switch, a signal from a first signal track to a second signal track. As such, the repeater structure may transfer the signal from an "A wire" to a "B wire" or from a "B wire" to an "A wire." The signal may be transferred multiple times in traveling from an origin to a destination. Signal paths may carry signals in part on fast wires and in part on slow wires. Signal paths may criss-cross. Signal paths may criss-cross using vias and a higher level metal. Other possibilities for transferring signals are considered.

The repeater structure may repower the signal. The signal may be repowered multiple times in traveling from the origin to the destination. Two signals traveling from origins on "A wires" and "B wires" may each reach destinations to achieve a timing tolerance standard. The timing tolerance standard may include a difference from an amount of time for a first signal path and a second signal path to carry a signal a distance from the origin to the destination. The amount of time may be the expected time for the signal paths to carry the signal the distance. The difference may be statistical or deterministic. The difference may be statistical when a signal path carries a signal on an equal number of "A wires" and "B wires." The difference may be deterministic when a signal path carries a signal on an unequal number of "A wires" and "B wires," such as embodiments where a signal path carries a signal on one more "A wire" or on one more "B wire." Other expected times and differences are considered.

FIG. 1 is a planar view showing double-patterned signal tracks carrying wires, repeater structure locations, and example signal paths pursuant to the disclosure. FIG. 1 depicts a semiconductor device 100 according to an embodiment. In FIG. 1, for example, signal tracks carrying "A wires" 101 (shown relatively wide) may be faster than signal tracks carrying "B wires" 102 (shown relatively narrow). The "A wires" 101 may have a shorter RC time constant than the "B wires" 102. The wires may be in segments shown in FIG. 1 as 101A, 101B, 101C, 101D, 101E for "A wires" and 102A, 102B, 102C, 102D, 102E for "B wires." Note that "A wires" are shown as being relatively wide in comparison to "B wires" due to tracking variations in processing the "A wires" and "B wires."

A signal track carrying a wire may have a signal path transferred to another signal track carrying a wire at a repeater structure 250. Repeater structure 250 generally refers to repeater structures; letters may be appended to refer to particular repeater structures 250. In an embodiment, the signal path may be alternated by one signal track. The signal path may alternate between "A wires" 101 and "B wires" 102, criss-crossing at repeater structures 250. In other embodiments, the signal path on "A wires" 101 and "B wires" 102 may be staggered in different ways such as an arrangement where signal paths include signal tracks where the transfer of a signal is to a signal track an odd number away. As in FIG. 1, the effect is that signal paths carrying example signals 251 and 252 may criss-cross.

The signal path criss-cross may occur in repeater structure 250, transferring a signal to a different signal track. Ultimately, the signal may weave back and forth between "A wires" 101 and "B wires" 102. As depicted in FIG. 1, the signal path of example signal 251 (shown as a dashed line) may originate on an "A wire" 101A, transfer in repeater structure 250AB to a "B wire" 102B, transfer in repeater structure 250BC to an "A wire" 101C, transfer in repeater structure 250CD to a "B wire" 102D, and transfer in repeater structure 250DE to an "A wire" 101E where signal 251 ultimately reaches its destination. Similarly, the signal path of example signal 252 (shown as a long/short dashed line) may originate on a "B wire" 102A, transfer in repeater structure 250AB to an "A wire" 101B, transfer in repeater structure 250BC to a "B wire" 102C, transfer in repeater structure 250CD to an "A wire" 101D, and transfer in repeater structure 250DE to a "B wire" 102E where signal 252 ultimately reaches its destination.

Two signal paths, each carrying a signal, traveling on an equal number of "A wires" 101 and "B wires" 102 may result in the signals traveling the same distance in a nearly equivalent amount of time as each other. A signal traversing in an alternating fashion between "A wires" 101 and "B wires" 102 may arrive at the destination at a time nearly equivalent to a signal traversing in an alternating fashion between "B wires" 102 and "A wires" 101. As in FIG. 1, signals 251 and 252 will reach their destinations at nearly the same time, having traveled on fast wires 101 and slow wires 102 the same distances (plus or minus the length of one wire segment). Such signal travel may occur without incurring a high RC path from origin to destination.

Figure 2:
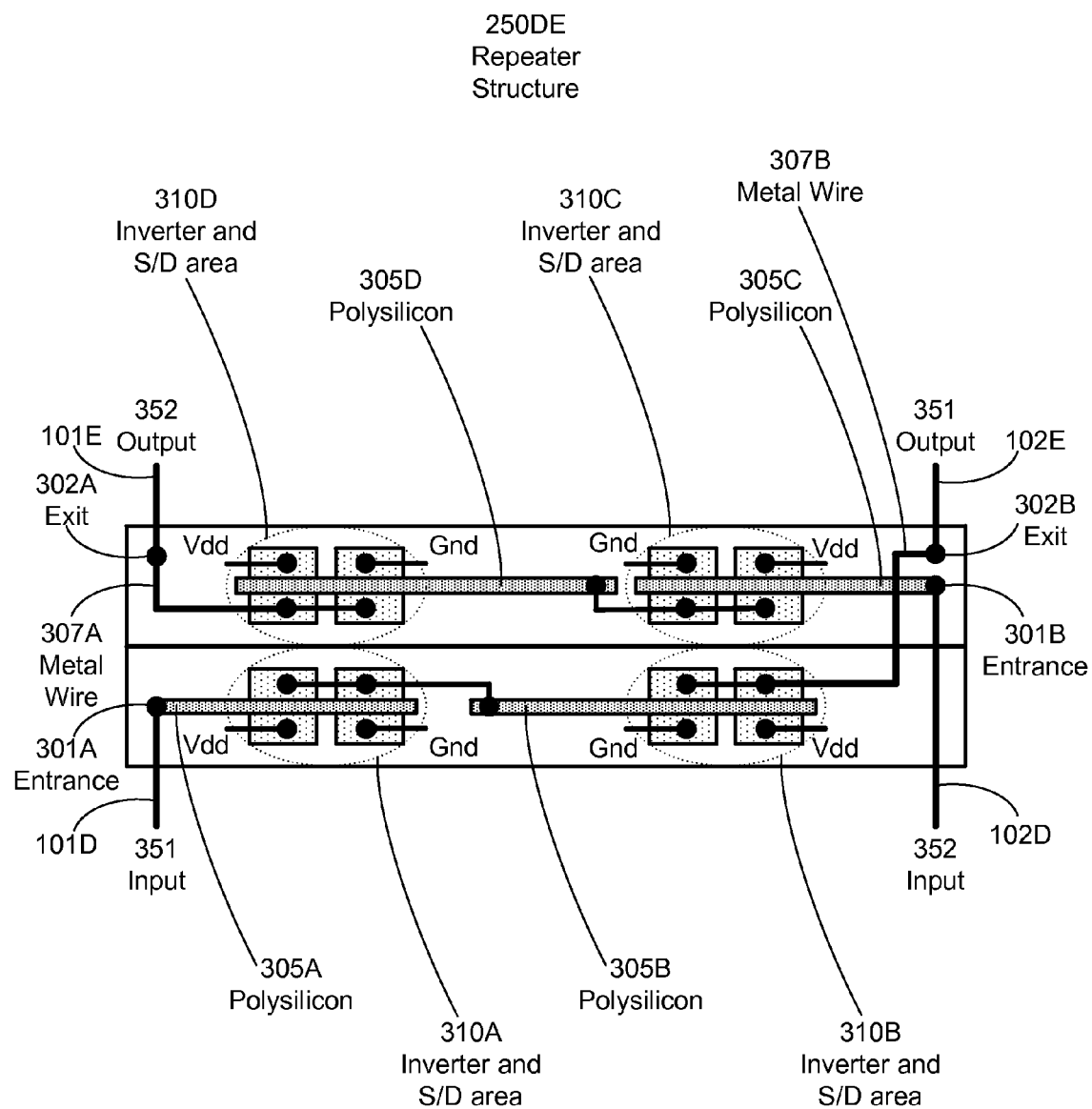
FIG. 2 is a planar view of a repeater structure which may both repower a signal and transfer a signal to a different signal track pursuant to the disclosure.

FIG. 2 is a planar view of a repeater structure of a semiconductor device which may both repower a signal and transfer a signal to a different signal track pursuant to the disclosure. In an embodiment depicted in FIG. 2, repeater structure 250DE may criss-cross and repower signals 351, 352. The criss-cross may transfer a signal from one signal track such as an "A wire" 101 to another signal track such as a "B wire" 102 or from a "B wire" 102 to an "A wire" 101. The criss-cross may occur in the repeater structure 250DE. Repowering signals 351, 352 may occur in repeater structure 250DE. Inverting a signal twice constitutes one option for repowering. Inverting a signal once is an option. Criss-crossing signals without repowering is an option.

For example, a first signal path carrying signal 351 may transfer signal 351 from an "A wire" 101D to a "B wire" 102E. The first signal path may include an entrance 301A for signal 351 to enter the repeater structure 250DE from "A wire" 101D. The first signal path may include polysilicon 305A carrying signal 351 to inverter and source-drain area 310A. The first signal path may include effectively duplicating the previous portion of the first signal path with polysilicon 305B carrying signal 351 to inverter and source-drain area 310B. Beyond inverter and source-drain area 310B, signal 351 carried on the first signal path may have been inverted twice and may be considered successfully repowered. The first signal path may include metal wire 307B for carrying successfully repowered signal 351. The first signal path may include an exit 302B for signal 351 to exit the repeater structure 250DE to "B wire" 102E.

A second signal path carrying signal 352 may transfer signal 352 from a "B wire" 102D to an "A wire" 101E. The second signal path may include an entrance 301B for signal 352 to enter the repeater structure 250DE from "B wire" 102D. The second signal path may include polysilicon 305C carrying signal 352 to inverter and source-drain area 310C. The second signal path may include effectively duplicating the previous portion of the second signal path with polysilicon 305D carrying signal 352 to inverter and source-drain area 310D. Beyond inverter and source-drain area 310D, signal 351 carried on the second signal path may have been inverted twice and may be considered successfully repowered. The second signal path may include metal wire 307A for carrying successfully repowered signal 352. The second signal path may include an exit 302A for signal 352 to exit the repeater structure 250DE to "A wire" 101E. Other configurations and possibilities are considered with other embodiments.

Figure 3:
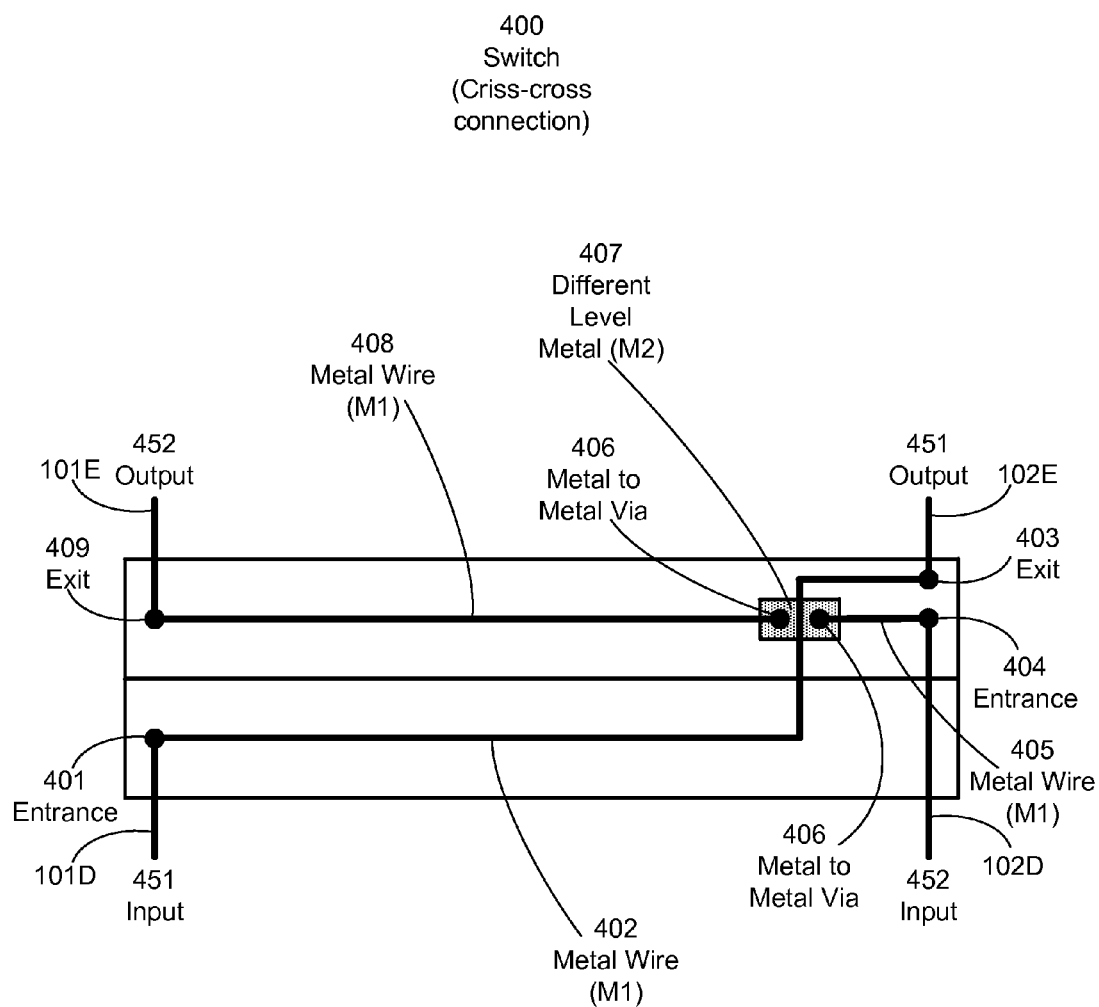
FIG. 3 is a planar view of a switch of a semiconductor device which may transfer a signal to a different signal track pursuant to the disclosure.

FIG. 3 is a planar view of a switch of a semiconductor device which may transfer a signal to a different signal track pursuant to the disclosure. In an embodiment depicted in FIG. 3, the switch 400 may criss-cross paths of signals 451, 452. The switch 400 may criss-cross signals without repowering. The switch may be a criss-cross connection that may be similar to repeater structure 250DE only simplified to not include repowering buffers. Similar to repeater structure 250DE, the criss-cross in the switch 400 may transfer a signal from one signal track such as an "A wire" 101 to another signal track such as a "B wire" 102 or from a "B wire" 102 to an "A wire" 101. Repowering signals 451, 452 may occur outside of the switch 400 such as occurring in a repeater structure such as 250DE further along a path. The switch 400 may allow for alternating repeater structures 250 with switches 400 along a signal path in an embodiment.

For example, a first signal path carrying signal 451 may transfer signal 451 from an "A wire" 101D to a "B wire" 102E. The first signal path may include an entrance 401 for signal 451 to enter the switch 400 from "A wire" 101D. The first signal path may include metal wire 402 on a first level metal for carrying the signal 451 within the switch 400. The first signal path may include an exit 403 for signal 451 to exit the switch 400 to "B wire" 102E. A second signal path carrying signal 452 may transfer signal 452 from a "B wire" 102D to an "A wire" 101E. The second signal path may include an entrance 404 for signal 452 to enter the switch 400 from "B wire" 102D. The second signal path may include metal wire 405 on the first level metal for carrying the signal 452 to a metal-to-metal via 406. Metal 407 on a second level metal allows for the criss-cross with metal wire 402 which is on the first level metal. The second signal path may include another metal-to-metal via 406 and a metal wire 408 on the first level metal for carrying signal 452. The signal path may include an exit 409 for signal 452 to exit the switch 400 to "A wire" 101E. In other embodiments, contacts and polysilicon could do the criss-cross using an underpass. Other configurations and possibilities are considered with other embodiments.

Figure 4:
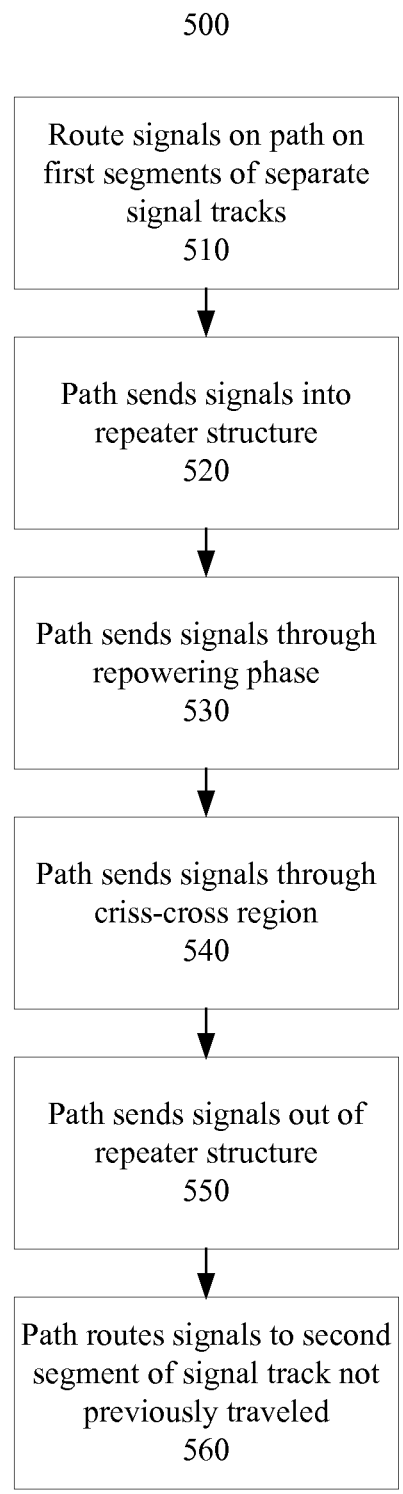
FIG. 4 is a flow chart illustrating an operation routing and criss-crossing signals on signal paths according to an embodiment.

FIG. 4 is a flow chart illustrating an operation routing and criss-crossing signals on signal paths according to an embodiment. Operation 500 may route a path of a first signal on a first segment of a first signal track patterned by a first mask on a wiring layer and route a path of a second signal on a first segment of a second signal track patterned by a second mask on the wiring layer at block 510. The paths of the first and second signals may include going through a repeater structure at block 520. The paths of the first and second signals in the repeater structure may include a repowering phase to repower each of the first and second signals at block 530. The paths of the first and second signals in the repeater structure may criss-cross at block 540. In other embodiments, the first and second signals may not be repowered in a repeater structure and may criss-cross in a switch. The paths of the first and second signals may include leaving the repeater structure at block 550. The paths of the first and second signals may then be such that the first signal may be routed on a second segment of the second signal track and the second signal may be routed on a second segment of the first signal track at block 560. At least a portion of the operation may be repeated across a semiconductor device. Other configurations and possibilities are considered with other embodiments.

Figure 5:
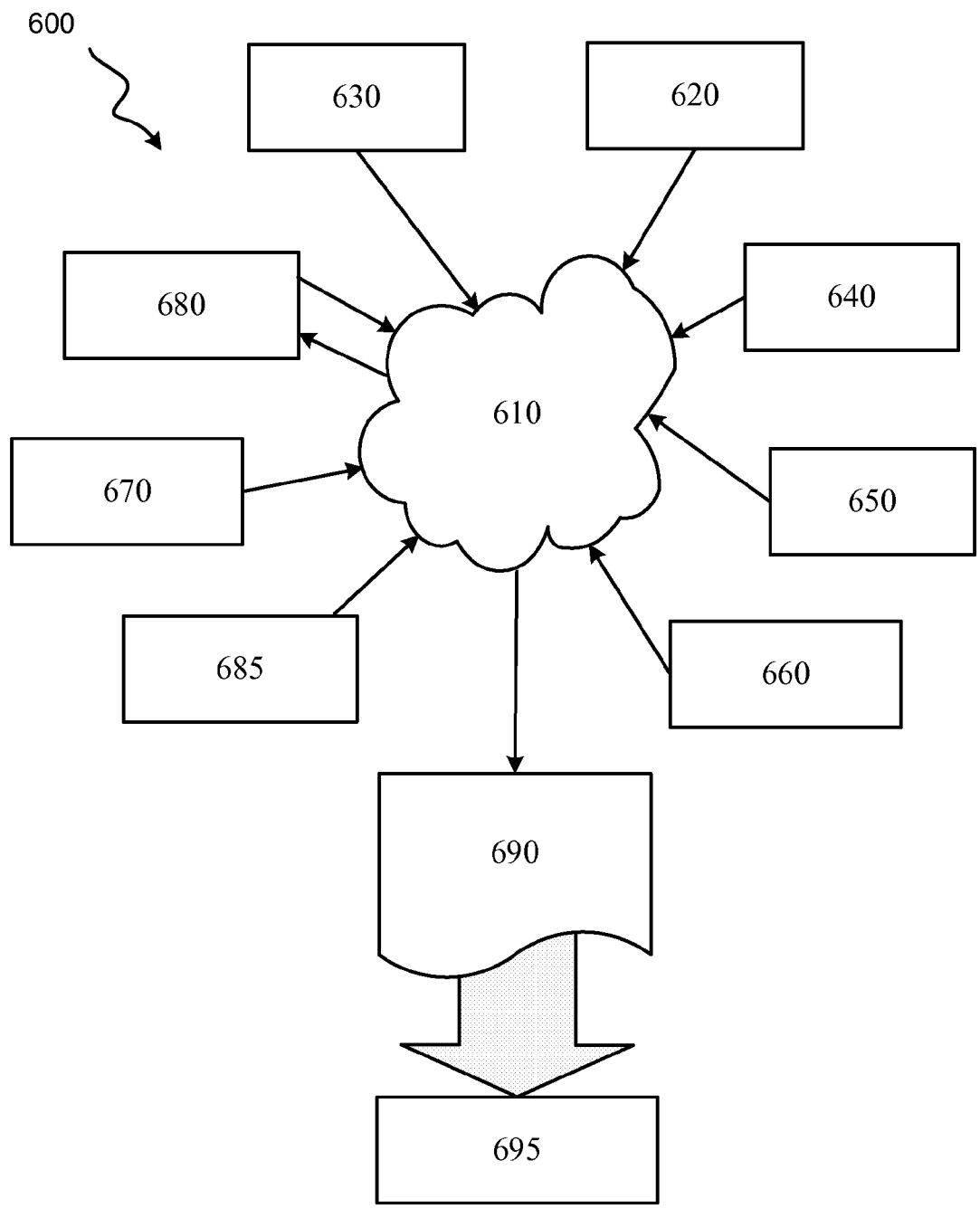
FIG. 5 illustrates multiple design structures including an input design structure that is preferably processed by a design process.

FIG. 5 illustrates multiple design structures 600 including an input design structure 620 that is preferably processed by a design process. Design structure 620 may be a logical simulation design structure generated and processed by design process 610 to produce a logically equivalent functional representation of a hardware device, such as semiconductor device 100. Design structure 620 may alternatively include data or program instructions that, when processed by design process 610, generate a functional representation of the physical structure of a hardware device. Whether representing functional or structural design features, design structure 620 may be generated using electronic computer-aided design, such as that implemented by a core developer/designer. When encoded on a machine-readable data transmission, gate array, or storage medium, design structure 620 may be accessed and processed by one or more hardware or software modules within design process 610 to simulate or otherwise functionally represent an electronic component, circuit, electronic or logic module, apparatus, device, or system such as those shown in FIGS. 1, 2 and 3. As such, design structure 620 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 610 preferably employs and incorporates hardware or software modules for synthesizing, translating, or otherwise processing a design/simulation functional equivalent of the components, circuits, devices, or logic structures shown in FIGS. 1, 2, and 3 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describe the connections to other elements and circuits in an integrated circuit design. Netlist 680 may be synthesized using an iterative process in which Netlist 680 is resynthesized one or more times depending on design specifications and parameters for the device. As with other design structure types described herein, Netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610, without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures, along with any additional mechanical design or data, to generate a second design structure 690. Design structure 690 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 1, 2 and 3. In one embodiment, design structure 690 may comprise a compiled, executable HDL simulation model that functionally simulates the devices shown in FIGS. 1, 2, and 3.

Design structure 690 may also employ a data format used for the exchange of layout data of integrated circuits and/or symbolic data format (e.g., information stored in a GDSII, GL1, OASIS, map files, or any other suitable format for storing such design data structures). Design structure 690 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 3. Design structure 690 may then proceed to a state 695 where, for example, design structure 690 proceeds to tape-out, is released to manufacturing, is released to a mask house, is sent to another design house, is sent back to the customer, etc.

What is claimed is:

1. A semiconductor device, comprising:
   a signal conductor layer comprising:
   a first signal track having a design width on the signal conductor layer defined by a first mask and processed to a first physical width;
   a second signal track having the design width on the signal conductor layer defined by a second mask and processed to a second physical width, wherein the first signal track is adjacent to the second signal track and physical widths defined by a single mask more closely track than physical widths defined by separate masks; and
   a repeater structure to achieve a timing tolerance standard adapted to repower a first signal on a first conductor in the first signal track and transfer the first signal to a second conductor in the second signal track, and to repower a second signal on a third conductor in the second signal track and transfer the second signal to a fourth conductor in the first signal track.

2. The semiconductor device of claim 1, wherein the repeater structure is adapted to transfer a signal to a conductor in a signal track in a different signal conductor layer.

3. The semiconductor device of claim 1, wherein the timing tolerance standard includes a difference from an amount of time for a signal path to carry a signal a distance.

4. The semiconductor device of claim 1, wherein the repeater structure is adapted to alternate the signal between the signal tracks to achieve the timing tolerance standard.

5. A semiconductor device, comprising:
   a layer having a first signal track having a design width created by a first mask and processed to a first physical width and a second signal track having the design width created by a second mask and processed to a second physical width, wherein physical widths defined by a single mask more closely track than physical widths defined by separate masks; and
   a switch adapted to criss-cross a first signal from the first signal track to the second signal track and adapted to criss-cross a second signal from the second signal track to the first signal track, wherein the second signal track is an odd number of signal tracks away from the first signal track.

6. The semiconductor device of claim 5, wherein the switch includes a buffer circuit to repower a signal.

7. The semiconductor device of claim 5, wherein the switch is adapted to alternate the signal between the first signal track and the second signal track to achieve a timing tolerance standard.

8. The semiconductor device of claim 7, wherein the timing tolerance standard includes a difference in a transmission time between the first and second signals.

9. A design structure tangibly embodied in a non-transitory machine-readable storage medium used in a design process of a semiconductor device, the design structure having elements that, when processed in a semiconductor manufacturing facility, produce a semiconductor device that comprises:
   a signal conductor layer comprising:
   a first signal track having a design width on the signal conductor layer defined by a first mask and processed to a first physical width;
   a second signal track having the design width on the signal conductor layer defined by a second mask and processed to a second physical width, wherein the first signal track is adjacent to the second signal track and physical widths defined by a single mask more closely track than physical widths defined by separate masks; and
   a repeater structure to achieve a timing tolerance standard adapted to repower a first signal on a first conductor in the first signal track and transfer the first signal to a second conductor in the second signal track, and to repower a second signal on a third conductor in the second signal track and transfer the second signal to a fourth conductor in the first signal track.

10. The design structure of claim 9, wherein the design structure comprises a netlist, which describes the semiconductor device.

11. The design structure of claim 9, wherein the design structure resides on a storage medium as a data format used for the exchange of layout data of integrated circuits.

12. The design structure of claim 9, wherein the design structure includes at least one of test data files, characterization data, verification data, or design specifications.

* * * * *